United States Patent [19]
Steffe et al.

[11] Patent Number: 4,675,549
[45] Date of Patent: Jun. 23, 1987

[54] BLACK AND WHITE REFERENCE AND END-OF-SCAN INDICATOR FOR CHARGE COUPLED DEVICES

[75] Inventors: Will C. Steffe, Sunnyvale; David D. Wen, Belmont, both of Calif.

[73] Assignee: Fairchild Camera and Instrument Corporation, Cupertino, Calif.

[21] Appl. No.: 719,657

[22] Filed: Apr. 3, 1985

Related U.S. Application Data

[63] Continuation of Ser. No. 621,140, Jun. 15, 1984, abandoned, which is a continuation of Ser. No. 419,097, Sep. 16, 1982, abandoned, which is a continuation of Ser. No. 130,676, Mar. 17, 1980, abandoned, which is a continuation of Ser. No. 875,711, Feb. 6, 1978, abandoned.

[51] Int. Cl.[4] .................... H03K 3/42; H01L 29/78; H01L 27/14; H01L 31/00
[52] U.S. Cl. .................... 307/311; 357/24; 357/30; 358/213.16; 358/213.23; 377/58
[58] Field of Search ............ 357/24 LR, 30; 307/311; 377/57–63; 358/213, 221

[56] References Cited
U.S. PATENT DOCUMENTS 3,584,146  6/1971  Cath et al. .................... 358/221
3,806,729  4/1974  Caywood ...................... 307/311
3,814,955  6/1974  Itoh et al. .................... 357/24 R
4,010,319  3/1977  Levine ......................... 357/30
4,293,877  10/1981 Tsunekawa et al. ........... 357/24 LR

OTHER PUBLICATIONS

Sequin et al., "Charge-Coupled Area Image Sensor Using Three Levels of Polysilicon" IEEE Trans. Electron Devices vol. ED-11 (11/74), pp. 712–720.
Moasen et al., "A 16-Kbit Block Addressed Charge-Coupled Memory Device" IEEE J. Solid State Circuits vol. SC-11 (2/76), pp. 40–48.
Kim, "Two-Phase Charge Coupled Linear Imaging Devices . . . " IEEE Int. Electron Devices Meeting (12/74), Tech. Dig., pp. 55–58.
Radio-Electronics, pp. 56–58.

Primary Examiner—Gene M. Munson
Attorney, Agent, or Firm—Ronald C. Fish

[57] ABSTRACT

Structure is disclosed for a charge-coupled device for generating reference signals indicative of black and white optical conditions and for generating an end-of-scan indicator signal. The black reference signal is generated by electrically and optically isolating one or more photosites of the CCD. A white reference signal is generated by injecting a controlled amount of charge into one or more elements of a shift register of a charge-coupled device. The end-of-scan indicator signal is generated by injecting a signal into at least one element of a shift register which does not have photosites associated with it. The black and white reference signals allow the utilization of the full dynamic range of the device under a wide range of operation conditions, while the end-of-scan indicator eliminates the need for external counting or reset circuits associated with conventional charge-coupled devices.

5 Claims, 11 Drawing Figures

BLACK AND WHITE REFERENCE AND END-OF-SCAN INDICATOR FOR CHARGE COUPLED DEVICES

This application is a continuation of U.S. patent application Ser. No. 621,140, filed 6/15/84, now abandoned, which was a continuation of U.S. patent application Ser. No. 419,097, filed 9/16/82, now abandoned, which was a continuation of U.S. patent application Ser. No. 130,676, filed 3/17/80, now abandoned, which was a continuation of U.S. patent application Ser. No. 875,711, filed 2/06/78, now abandoned.

BACKGROUND OF THE INVENTION

1. Field of the Invention

This invention relates to electronic circuits and structures, and in particular, to charge-coupled devices (herein CCD) used for line or area imaging.

2. Prior Art

Charge-coupled semiconductor devices were first invented by W. S. Boyle and G. E. Smith. See "Charge-Coupled Semiconductor Devices," Bell System Technical Journal, Vol. 49, page 587, by Boyle and Smith, and U.S. Pat. No. 3,858,232, issued to Boyle and Smith. Since then the development of charge-coupled devices has been described in numerous publications. For example, see the article by Gilbert F. Amelio entitled "Charge-Coupled devices", Scientific American, February 1974, Vol. 230, No. 2, at page 23. It is now well known that line and area imaging devices may be fabricated from arrays of charge storage elements, and such devices are commercially available, for example, products CCD 101, CCD 110, CCD 121, CCD 201 of Fairchild Camera and Instrument Corporation, (herein "Fairchild") assignee of this application. With suitable known structures, the charge stored in the photosites may be transferred into shift registers, and by application of appropriate signals, transferred out of the shift registers to be sensed, amplified, or otherwise utilized by electronic circuits.

Unfortunately prior art charge-coupled imaging devices have been unable to provide an internally generated reference signal indicative of the intensity or halftone of the light impinging upon the photosites of the CCD, but rather supply information only about the relative intensity of light striking a given photosite compared with other photosites. Only relative information is generated because the video output signal of charge-coupled imaging devices typically is superimposed on a direct current level of several volts, for example +7 to +10 volts. This DC level is usually established by a reset circuit, floating gate potential, or amplifier biasing points and supply voltages. The exact voltage levels for black and white signals of prior art CCD's could be established only by operating the CCD in darkness and in conditions which cause saturation or near saturation by an appropriate optical condition. Even when this procedure was followed, calibration settings made in such tests were subject to drift due to changes in the operating conditions of the device, for example, ambient temperature, supply voltage, or circuit drift.

Further, prior art charge-coupled devices require a relatively large amount of external circuitry devoted to resetting and/or recycling the charge-coupled device to transfer a new set of signals into the shift registers after all of the preceding sequence of data has been transferred out of the shift registers. For example, in prior art line imaging devices a series of counters is utilized to ascertain the number of cycles of transfer signals to be applied to the elements of the shift registers before activating a transfer gate to allow a new set of signals, represented by packets of electrical charge, to be transferred from the photosites into the shift registers. This peripheral circuitry increases the complexity and cost of any system using CCD's.

SUMMARY OF THE INVENTION

Applicants have invented a new CCD structure which may be used to provide black and white reference signals indicative of the least and the most light, respectively, which the CCD can sense. The black reference signal is generated by one or more optically darkened and electrically isolated light sensitive regions of the CCD. By preventing light from entering these photosites, the signal from the photosites will be indicative of the absence of light, that is, a black reference signal. This black signal, after being transferred from one or more photosites into a shift register and then transferred out of the CCD, may be used as a reference signal for comparison with other signals from the CCD to provide an indication of the darkest optical condition the CCD may sense.

A white signal may also be generated by the CCD at a selected level indicative of some lighter, that is, non-black, condition the CCD may sense. This is accomplished by injecting a predetermined maximum amount of charge into one or more elements of the CCD shift registers. When these signals are transferred out of the CCD they provide a reference signal indicative of the selected lighter optical condition the CCD may sense. Additionally, by injecting smaller or larger predetermined amounts of charge, a reference signal indicative of any desired intermediate shade of grey or white may be created.

The generation of both black and white reference signals provides a fixed point at each end of a grey scale, and thereby defines the optical range over which the CCD is sensitive. Given the reference signals and knowledge of the linearity of the CCD's response over the optical range, a user of the CCD may obtain an accurate scaling of the shade of grey of any optical condition sensed by the CCD.

In one embodiment the amount of charge injected to generate the white signal is not indicative of the lightest optical condition the CCD may sense (corresponding to saturation of the photosites), but rather of the lightest linearly reproducible signal. Using this white signal and a black signal all intermediate signals generated by the CCD may be scaled linearly between black and white to precisely sense their respective halftones, thereby facilitating their accurate retention, transmission, or reproduction, for example, by facsimile machine.

By also injecting a charge packet, for example, the same signal as the white signal, into an additional isolated shift register which does not hve photosites associated with it and which has as many elements as the other CCD shift registers used for receiving and transmitting signals from the photosites, an end-of-scan indicator signal may be generated. That is, the signal will be injected into the "far" end of a shift register and will be the only signal in that shift register. By stepping this signal out of that otherwise empty register at the same rate that the signals generated by the photosites are stepped out of corresponding shift registers, the signal may be used to provide a direct positive electrical indication to reset the CCD to begin a new scan of the shift register or registers.

In one embodiment the white signal is generated by a diode receiving a signal from a pair of MOS transistors. The source of the first MOS transistor is connected to the drain of the second, with bias voltages applied to the drain and gate of the first, and the source and gate of the second are connected together. By appropriately sizing the first and second transistors a substantially constant voltage may be supplied to the input diode. The charge of the input diode may then be transferred to an element of a shift register in response to the same clock signal which transfers the accumulated charge from the photosites into the shift registers. By appropriate sizing of the MOS transistors and by application of the proper voltages to them, the injected charge may be made the desired amount.

DETAILED DESCRIPTION

Figure 1:
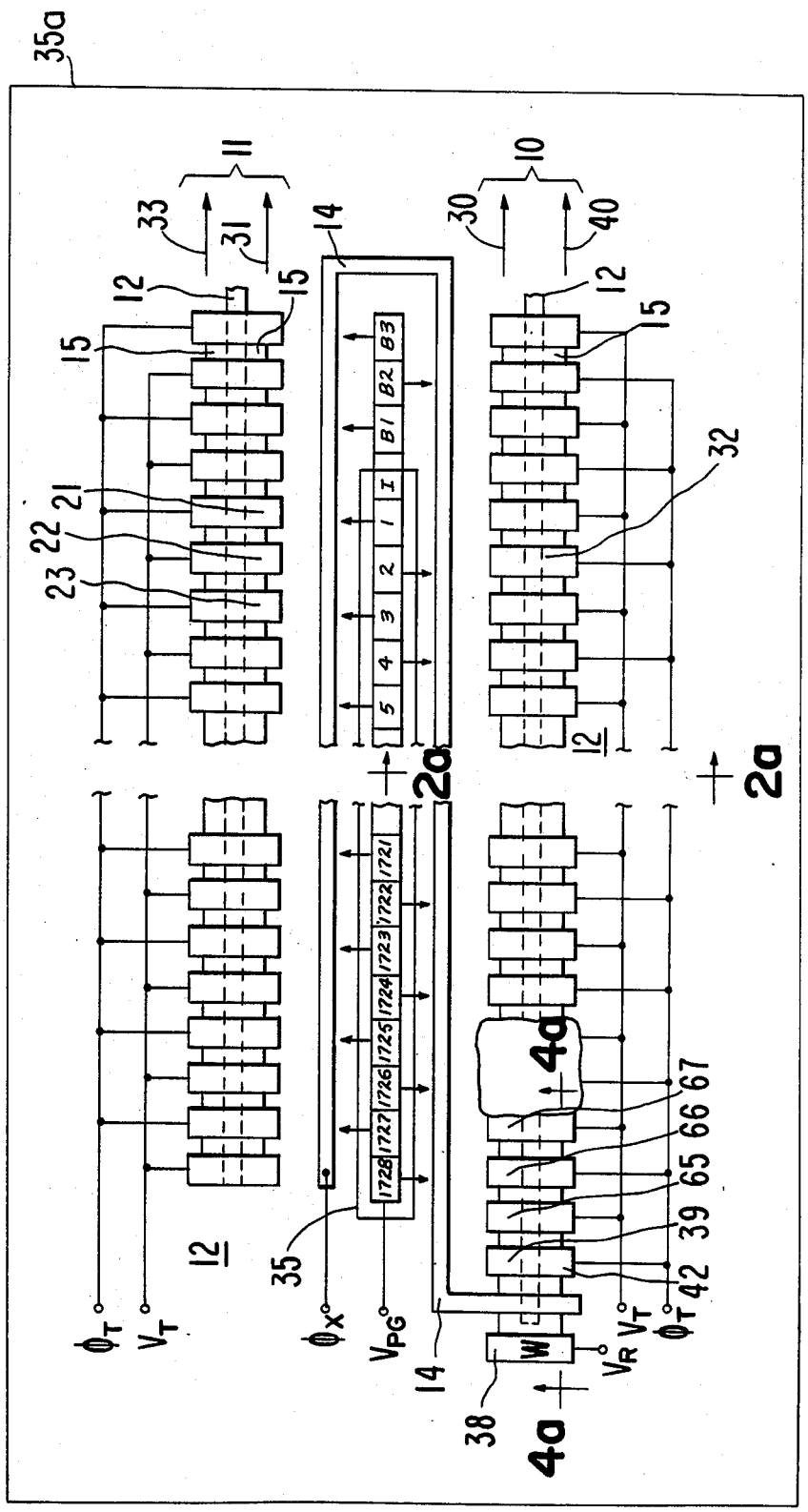
FIG. 1 is a simplified plan view of the structure of one embodiment of this invention.

FIG. 1 is a simplified plan view of the structure of one embodiment of this invention as embodied in and applied to a 1728 element linear imaging array. Fairchild product CCD 121 is an example of such a product prior to application of the techniques of this invention. Shown schematically in FIG. 1 are the 1728 photosites which generate an electrical charge in response to electromagnetic radiation impinging upon them. In a well-known manner the charges accummulating within each photosite may be transferred simultaneously to one of two shift registers 10 or 11. As shown in FIG. 1, for example, charges accummulating within odd-numbered photosites are transferred into shift register 11, while those accummulating within even-numbered photosites are transferred to shift register 10. Shift registers 10 and 11 each may be divided into two separate shift registers by isolation region 12.

The transfer of charge from the photosites 1 . . . 1728 to the shift registers 10, 11 typically is accomplished by application of a signal $\phi_X$ to an electrode 14. This technique is well known in the CCD art; however, it is explained in further detail in conjunction with FIGS. 2a–2d. The intermixing of signals in contiguous elements of the CCD shift registers is prevented by transferring the charge in odd-numbered photosites in one direction, i.e., to register 11, and transferring the charge in even-numbered photosites in the other direction, i.e., to register 10. In this manner charge packets are transferred into every other element of shift registers 10 and 11. For example, the charge accummulated in photosite 1 is transferred to the region beneath electrode 21, while the charge accummulating in photosite 3 is transferred to the region beneath electrode 23. Because no charge is transferred to the region beneath electrode 22, it may be maintained at a different potential than electrodes 21 and 23. Therefore, the signals transferred to the regions beneath electrodes 21 and 23 are prevented from commingling. This prevents a loss of information. As shown in FIG. 1, the signal from photosite number 2 is transferred to beneath electrode 32.

After the charges in the 1728 photosites are transferred into the shift registers 10 and 11, the potential of signal $\phi_X$ may be changed to allow a new set of signals to begin accummulating within the 1728 photosites. Then by application of appropriate signals, for example, $\phi_T$ and $V_T$, to the shift register elements, the signals beneath the electrodes may be stepped out of the upper position of shift register 10 and the lower portion of shift register 11 to an output gate. The transfer of these signals to the output gate is designated by arrows marked 30 and 31 in FIG. 1. Output gate structures are known in the art. See, e.g., U.S. Pat. No. 3,999,082 entitled "Charge Coupled Amplifier" and isued to James Early.

In one embodiment of the invention shown in FIG. 1, the signals from the 1728 photosites will not be transferred into the lower portion of shift register 10 or the upper portion of shift register 11. Transfer of charges into these portions of the shift registers is prevented by the region 12, typically a region of oxide isolation, which effectively divides each of shift registers 10 and 11 into two separate shift registers. The transfer of charge from one electrode to the next within each of the shift registers is made possible by the channel region 15 extending beneath the electrodes and between the barrier implants 58. The upper portion of shift register 11 and the lower portion of shift register 10 prevent stray charges within the substrate from wandering into the shift register elements and distorting the information stored therein. That is, the stray charges are collected by these isolated shift registers and disposed of harmlessly. Arrows 33 and 40 designate the transfer of these stray charges to a sink region or voltage supply. As will be explained, however, in some embodiments the signals designated by arrow 40 may be supplied to an external circuit.

Black and white reference signals are generated by the CCD structure shown in FIG. 1 in the manner described below. In one embodiment the black reference signals are generated by the addition of several optically and electrically isolated photosites B1, B2, B3. Of course any desired number of such photosites may be provided. Photosite B1 (and B2 and B3) are separated from active photosites 1, 2 . . . 1728 by an isolating region I. It should be understood that these photosites may be disposed at any desired location within or along photosites 1, 2, . . . 1728. In particular, such photosites may be interspersed with the ordinary active photosites 1 . . . 1728, disposed at one end or the other of the photosites, or both, or some combination of the foregoing. In FIG. 1 they are shown at the right end of the linear array.

The black photosites B1, B2, B3 typically will be separated from the active photosites by an isolation cell I. This prevents electrical charges within any of the active cells from leaking into any of the black reference cells B1, B2, or B3. It further provides a manufacturing tolerance for definition of a window 35. The window 35 allows electromagnetic radiation, typically visible light, to impinge upon the photosites 1, 2 . . . 1728. Surrounding window 35 is a light shield 35a which prevents light from impinging upon the black reference cells B1, B2 and B3, and the remainder of the surface of the structure of FIG. 1.

In some embodiments of this invention, window 35 may be a material which is transparent to some and opaque to other selected wavelengths of visible electromagnetic radiation. For example, if a blue color signal is to be sensed, window 35 will be opaque to all other wavelengths. Because the location of the light shield 35a prevents light from impinging upon the black reference photosites B1, B2 or B3, these photosites will not accummulate any charge, or will accummulate a charge indicative of all conditions in the substrate except for the effect of the visible light which is only sensed by the photosites 1, 2 . . . 1728. In this manner, the black reference photosites B1, B2, B3 provide an automatic correction for dark current or other errors caused by temperature, chemical composition, or other environmental conditions.

One technique for generating the white reference signal is shown at the left end of shift register 10. By application of signal $V_R$ to diode 38, a signal charge will be supplied to the diode which, when the potential of $\phi_X$ is suitably increased, will be transferred into shift register elements 39 and 42. In a manner as explained in conjunction with FIGS. 4a–4e herein, this charge may be appropriately sized to indicate the level of brightness which causes saturation, or some other desired reference charge level, for example, a less bright condition or shade of gray. This charge is referred to herein as the white reference signal. That portion of the charge injected into shift register element 42, upon application of signals $V_T$ and $\phi_T$, will be transferred out of shift register 10 following the transfer of the signal charges generated by the 1728 photosites. The white reference signal also may be injected at some other desired location along shift register 10 by suitable modification of the structure shown in FIG. 1.

That portion of the white reference signal injected beneath electrode 39 may be utilized as an end-of-scan indicator. That is, by placing the white reference signal generator at the "far" end of the shift register 10, as shown in FIG. 1, the signal transferred beneath electrode 39 will emerge from shift register 10 after the signal which originated in photosite 1728. The white reference signal therefore provides an electrical signal which indicates the completion of the transfer of signals out of shift register 10. In contrast, prior-art structures required independent counting apparatus to ascertain the appropriate time for application of signal $\phi_X$. The white reference signal from diode 38, when transferred out of the lower portion of shift register 10, may be transferred to any well-known external logic circuit which then activates signal $\phi_X$.

Figure 2A:
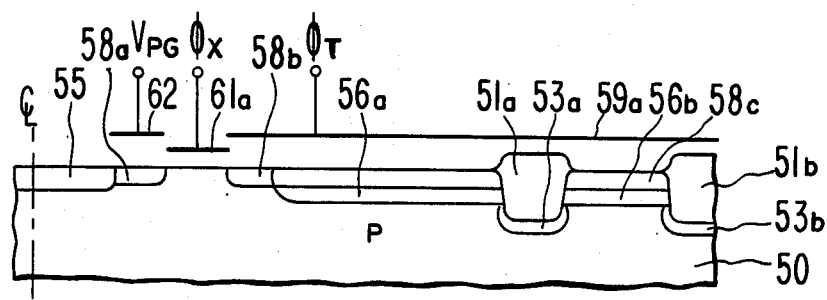
FIG. 2a is a simplified cross-sectional view of a portion of the structure shown in FIG. 1.

FIG. 2a is a cross-sectional view of part of the structure depicted in FIG. 1 when fabricated using a buried channel. Formed in substrate 50, typically P conductivity type, are a series of isolation regions 51a and 51b, which typically comprise silicon dioxide. P+ conductivity type regions 53a and 53b are sometimes formed beneath isolation regions 51 to prevent stray ions from forming a conductive path beneath insulation regions 51. An N conductivity type region 55 formed in substrate 50 will accumulate electrical charge in response to ambient electromagnetic radiation. Buried channel regions 56a and 56b, typically doped with phosphorus, arsenic or other N-type material, and regions 58a, 58b, and 58c, typically doped with boron or other P-type material, form barrier regions which change the potential profile of the structure in a manner which will be explained below. Also shown schematically in FIG. 2a are electrodes overlying substrate 50. Electrode 59a is connected to receive signal $\phi_T$, while electrode 61a is connected to receive signal $\phi_X$. Electrode 62 is connected to receive signal $V_{PG}$.

Figure 2B:
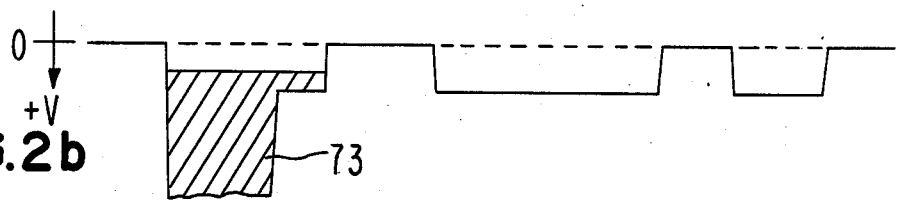
FIGS. 2b–2d are potential energy profiles for the structure shown in FIG. 2a showing how a packet of charge is transferred from a photosite to a shift register.
Figure 2C:
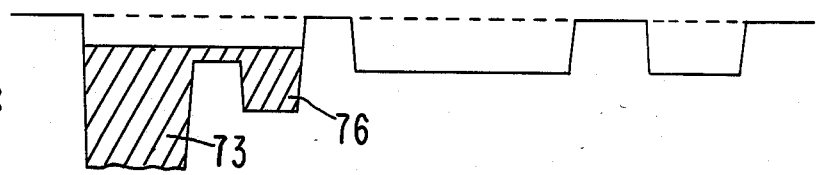
Figure 2D:
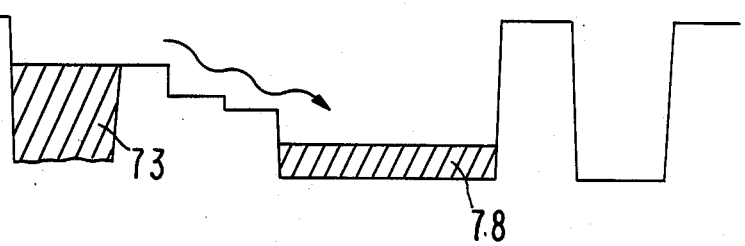

Shown directly beneath the structure depicted in FIG. 2a are a series of potential profile diagrams designated FIGS. 2b, 2c and 2d which depict how, upon application of signal $\phi_X$, an electrical charge 73 accumulated within region 55 may be transferred to the region beneath electrode 59a. Once the charge is so transferred, it may be transferred out of the CCD by application of signals $\phi_T$ and $V_T$ as will be described in conjunction with FIG. 4.

The potential profile shown in FIG. 2b depicts the condition of the structure shown in FIG. 2a when signals $\phi_X$ and $\phi_T$ are each of zero potential. In this condition electrical charge accumulates in the potential well created by region 55. The accumulated charge is depicted by the crosshatched region 73 in FIG. 2b.

Next, as shown in FIG. 2c, by increasing the potential of signal $\phi_X$, and thereby deepening the potential well beneath that electrode 61a, a portion of charge 76 is transferred from region 55 and temporarily stored beneath electrode 61a.

Next, as shown in FIG. 2d, the potential of signal $\phi_T$ is increased to thereby allow the charge 76 stored beneath electrode 61a to be transferred to beneath electrode 59a and stored in region 56a. Once the charge 78 is stored beneath electrode 59a in region 56a, the potential of signal $\phi_X$ may be lowered to prevent any further charge from being transferred from region 55 to region 56a until appropriate signals $\phi_T$ and $V_T$ are applied to transfer the charge 78 beneath electrode 59a in region 56a out of the CCD device into such other electronic circuitry as desired.

Figure 3:
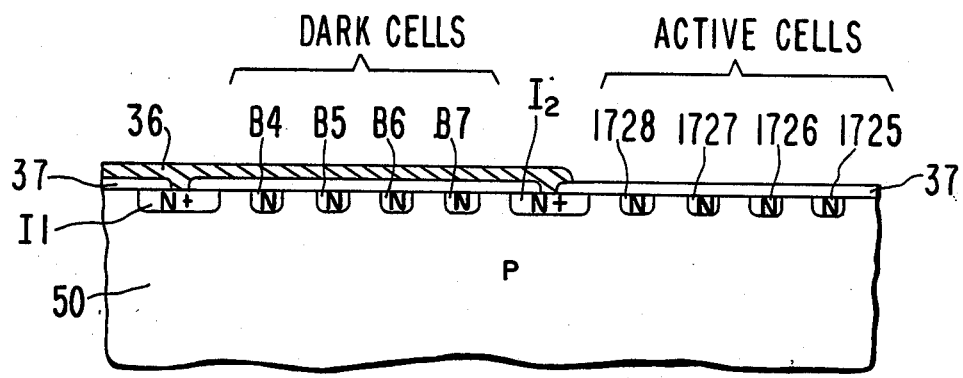
FIG. 3 is a simplified cross-sectional schematic of a group of black reference cells.

FIG. 3 is a simplified schematic view showing a cross-section of a series of four dark reference cells as they would appear if disposed at the opposite end of the active elements from the dark cells shown in FIG. 1, that is, at the left end of a series of CCD photosensitive elements 1725, 1726, 1727, and 1728. The dark reference cells B4, B5, B6, and B7, are separated from adjoining active cells or other circuitry by isolation cells I1 and I2. Visible light is prevented from impinging upon dark cells B4 through B7 by cover 36, which may be any suitable material, for example, aluminum. Cover 36 is typically formed on an insulating layer 37 to prevent it from contacting the surface of substrate 50 or regions formed therein. Dark cells B4 through B7 will generate a signal indicative only of conditions within substrate 50, for example, temperature.

The isolation cells I1 and I2 are reversed biased N+ diffused diodes, and function to remove any stray charge carriers in that region. The isolation cells may be easily reversed biased by connecting them to aluminum light shield 36 as shown in FIG. 3, and then applying the desired potential to shield 36.

Figure 4A:
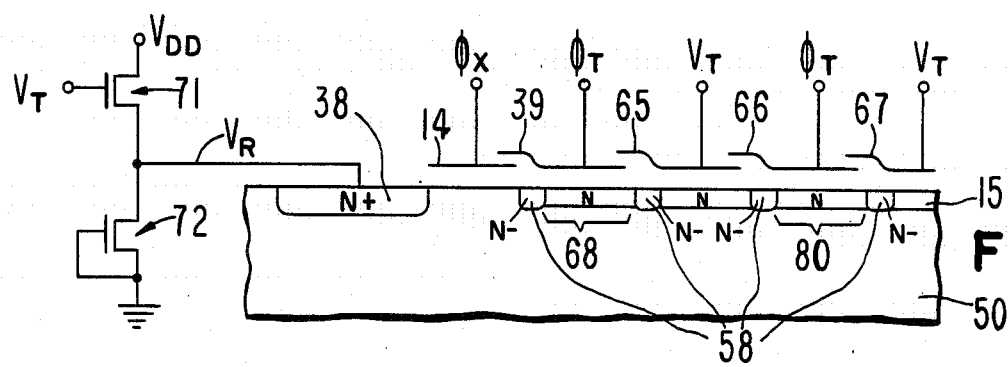
FIG. 4a is a simplified schematic of one method by which the white reference signal may be generated.

FIG. 4a is a cross-sectional view taken through a portion of FIG. 1 to show the operation of the white reference signal generator together with the operation of the end-of-scan indicator. The structure depicted in FIG. 4a is given the same numerical designations as the structure shown in FIG. 1. To generate the white reference signal two MOS transistors 71 and 72 are used to generate a signal $V_R$ which is applied to region 38. As shown in FIG. 4a the gate electrode of transistor 71 is connected to receive signal $V_T$, while the drain electrode is connected to receive signal $V_{DD}$. MOS transistor 72 has a gate electrode connected to the source electrode which is connected to ground. Transistor 72 in effect provides a constant current source to transistor 71 to create a signal $V_R$ which is substantially equal to $V_T$ minus a threshold voltage. By appropriate sizing of transistors 71 and 72, signal $V_R$ may be chosen to inject any desired amount of charge. The maximum size of the injected packet of charge which a shift register may receive from the photosite, that is, the size of a saturation charge, will be determined by the barrier height $V_B$ caused by barriers 58, and the physical dimensions of the region into which it is transferred, e.g., region 80. Region 77 in FIG. 4d graphically depicts this amount. The amount of charge actually transferred from region 38, however, can be a lesser amount, as determined by the potential barrier $V_B$ caused by barriers 58, and the physical dimension of region 68. This amount of charge is graphically depicted as region 75 in FIG. 4e. Since the barrier heights are the same in both cases, the physical dimension 68 may be adjusted to restrict the white signal charge to a selected fraction of the saturation charge, for example corresponding to the upper limit of the linear range of sensitivity of the CCD photosites. One advantage of generating the white signal in the manner described above is that the magnitude of the signal may be altered by changing the dimensions of the structure rather than the parameters of the process. Because dimensions typically may be more accurately controlled than the parameters of the process, this feature allows more accurate control of the white signal. In one embodiment the white signal charge is 80 percent of the saturation charge. In this manner a linear relationship will be created to thereby enable the signal generated by any particular photosensitive region 1 ... 1728 to be precisely related to a linear range of grey tones between black and white.

The charge accumulated within region 38 as a result of signal $V_R$ from transistor 71 and 72 may be transferred along the upper portion of the shift register 10 shown in FIG. 1 and supplied to other circuitry to provide the white signal in the manner depicted in FIGS. 4b through 4e.

Figure 4B:
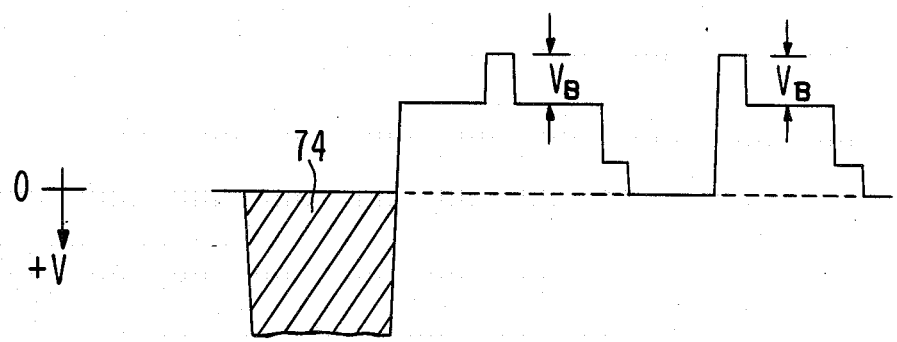
FIGS. 4b–4c are potential energy profiles for the structure shown in FIG. 4a showing how a packet of charge (the white reference signal) is transferred from one element of a shift register to the next in either the shift register which transfers the end-of-scan indicator signal or a conventional CCD shift register.
Figure 4C:
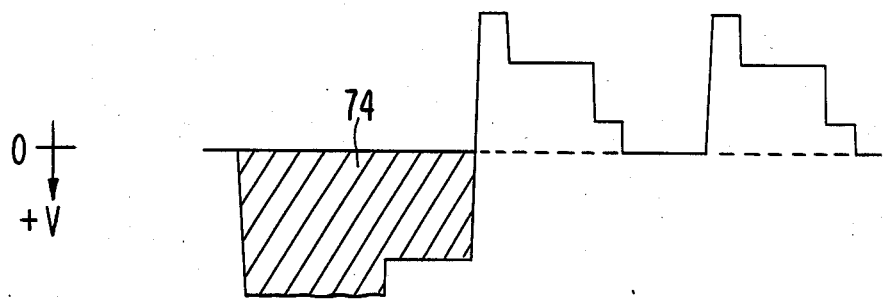

As shown in FIG. 4b, when signal $\phi_X$ is low it creates a potential barrier trapping all charge 74 accumulated in region 38 as a result of signal $V_R$. Next, as shown in FIG. 4c, by maintaining signal $\phi_T$ (applied to electrode 39) at a low potential and increasing the potential of signal $\phi_X$ 9 supplied to electrode 14), the charge 74 within region 38 will also accumulate beneath electrode 4. Signal $\phi_T$, held at a low potential, however, prevents the transfer of charge 74 from electrode 14 to electrode 39.

Figure 4D:
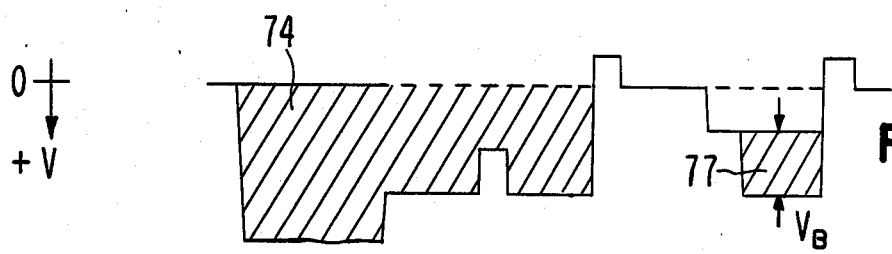
Figure 4E:
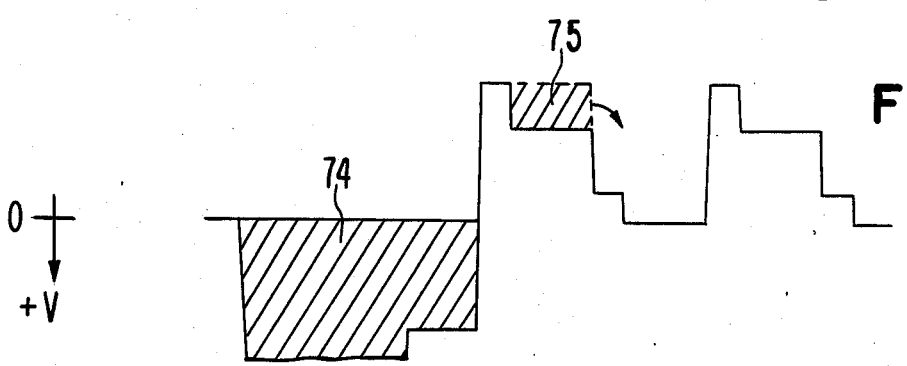

Then, as shown in FIG. 4d, the potential of signal $\phi_T$ applied to electrode 39 is increased while signal $V_T$ applied to electrode 65 is held at its previous level. This allows the charge 74 from beneath electrode 14 to be transferred to beneath electrode 39. Next, as shown in FIG. 4e, the potential of signal $\phi_T$ applied to electrode 39 is decreased. This, in effect, separates a portion 75 of charge from the greater amount remaining beneath electrode 14 and in region 38. This portion of charge 75, as a result of potential $\phi_T$ being lowered, is transferred to beneath electrode 65. Then, by continued pulsing of signal $\phi_T$ the charge packet 75 may be transferred progressively from one electrode to the next, finally arriving at the right hand end of the upper portion of shift register 10 depicted in FIG. 1, to thereby be supplied to such other circuitry as desired, depicted by arrow 30.

In the same manner as described above in conjunction with the upper portion of shift register 10, the signal injected beneath electrode 39 also will be injected beneath electrode 42. This signal will follow the 1728 signals generated by the 1728 photosites to provide an end-of-scan signal. The charge thereby injected may be utilized in a well known manner to activate some other electronic circuit to cause the CCD to be reset in preparation for transfer of a new set of charges from photosites 1 ... 1728 to the shift registers.

The structure of Applicant's invention provides numerous advantages over prior art structures. In particular, the black reference cells provide a black reference signal which is compensated for dark current signals, for temperature effects, for clock signal variation, for output amplifier variations, and, in general, for any errors introduced into all of the photosensitive regions. The white reference cell also provides substantial advantages by generating a signal indicative of white light or any desired shade of gray. Additionally, the same white reference signal, when injected into a separate shift register, may be utilized to provide an end-of-scan indicator to reset the operation of the CCD device, thereby eliminating the need for prior art counting networks associated with large CCD devices.

What is claimed is:

1. A charge-coupled device fro generating signals corresponding to an ambient light condition, a reference dark condition, and a reference light condition comprising in combination:

a plurality of photosites, each of said photosites being responsive to ambient light for accumulating a charge having a magnitude corresponding to the intensity of the ambient light impinging thereon;

means for exposing a first predetermined number of said photosites to said ambient light:

means for shielding at least one dark reference photosite from ambient light whereby said at least one photosite accumulates a charge having a magnitude corresponding to said reference dark condition;

means for electrically isolating said first predetermined number of photosites from said at least one dark reference photosite to thereby prevent charge accumulating in said first predetermined number of photosites from flowing into said at least one photosite;

means for injecting and storing a white reference signal charge indicative of the upper limit of the linear range of sensitivity of the photosites;

an output gate;

means for transferring said white reference signal charge and the charges from said first plurality of photosites and from said at least one dark reference photosite to said output gate;

and signal processing means for converting the charge from said dark reference photosite into a dark reference signal and the charge from said white reference charge injecting means into a white reference signal and for converting the charge from said first plurality of photosites into video signals.

2. A device according to claim 1 wherein said transferring means comprises:

a first register means for receiving the charges accumulated in each of said photosites and the charge from said white reference injection means and means for shifting the contents of said register means to said signal processing means.

3. A device according to claim 2 wherein said injection means comprises a a diode coupled to said register means and transistor means coupled to drive said diode with a predetermined voltage.

4. A device according to claim 1 wherein said white reference signal charge is also an end-of-scan charge for providing an end-of-scan signal.

5. A device according to claim 4 wherein said transferring means comprises:

register means for receiving said end-of-scan charge; and means for shifting said end-of-scan charge to said output gate structure of said device.

* * * * *